APPARATUS FOR FORMING AND POSITIONING

Filed Oct. 26, 1966 4 Sheets-Sheet 1

INVENTORS
KENDALL CLARK
THEODOR HERRMANN
JOCELYN C. LATTIN
JOHN MEDWID

BY Wolmar J. Stoffel
ATTORNEY

United States Patent Office 3,465,408

Patented Sept. 9, 1969

3,465,408

APPARATUS FOR FORMING AND POSITIONING

Kendall Clark, Poughkeepsie, Theodor Herrmann, Holmes, Jocelyn C. Lattin, Pleasant Valley, and John Medwid, Wappingers Falls, N.Y., assignors to International Business Machines Corporation, Armonk, N.Y., a corporation of New York Filed Oct. 26, 1966, Ser. No. 589,645

Int. Cl. B26d 7/06

U.S. Cl. 29—203 8 Claims

ABSTRACT OF THE DISCLOSURE

Assembling machine for forming and positioning of wire elements, more particularly, automatic apparatus for forming generally U-shaped bridging elements for micro-miniaturized circuit devices, and precisely positioning the bridging elements on device substrates.

The trend in modern electronic technology is toward very small and compact electronic circuitry modular units. One particular form of technology is termed the hybrid technique in which a small substrate normally forms the base for supporting conductive lands, individual semiconductor chips fused to the lands, printed resistors, inductances, etc. as discussed more fully in commonly assigned application Ser. No. 459,179. The production of such modular units is desirably automated since manual sorting, testing, and assembly of the very small components is time consuming, tedious, and expensive.

In the production of printed circuits in general, and particularly in hybrid technology, it is frequently necessary to form a connection between two spaced conductor strips or lands which are separated by a third land which must remain insulated from the first mentioned lands. Known methods of forming such bridging connections include laying down an insulating coating over the center land and subsequently forming a connecting land over the coating to connect the desired lands. This technique involves at least two separate steps which require considerable time, effort, and equipment to carry out, particularly if the circuit patterns vary frequently. Another method involves the forming of U-shaped elements and manually positioning them in the desired locations. This manual sorting and positioning requires considerable time and effort, is subject to human error, and is generally not compatible with automated production lines fabricating module units or other printed circuit devices.

The known apparatus for shaping and assembling wire elements, as for example, the shaping and welding of electronic tube components, transistor terminals, etc. are not capable of forming and precisely positioning bridging elements on printed electronic circuit devices. The bridging elements are normally very small in size. The sorting and picking up of such elements for positioning is very difficult to automate if such are made in advance of assembly. The only apparent practical approach to the automation of making bridging elements on a printed circuit device appears to be first forming the bridging elements and then immediately positioning them with the same apparatus used in the forming. The known apparatus are not capable of firmly holding a very small and fragile bridging element, and subsequently releasing it when it is in position. Moreover, other problems are presented in bridge element installation, such as how to seat the bridging element on the lands with a pressure that is uniform and firm, but not too firm, how to facilitate the setting up of the apparatus to relocate the bridge elements for different circuit patterns, how to facilitate the apparatus for setting the bridge elements at different angular locations relative to the substrate etc., which find no suggestion of a solution in the apparatus of the prior art.

It is an object of this invention to provide an apparatus for forming and positioning wire elements.

Another object of this invention is to provide an automatic apparatus particularly adapted for the forming of and positioning of a bridging element on a substrate.

Another object of this invention is to provide an apparatus for forming and positioning wire elements having a transfer element provided with a retaining means and an ejection means for retaining and subsequently ejecting the wire element.

Yet another object of this invention is to provide an apparatus for forming and positioning a wire element on a substrate having a pressure biased transfer element to enable a wire element to be seated with a uniform and firm pressure on the substrate.

Still another object of this invention is to provide a apparatus for forming and seating wire elements particularly adapted for forming and seating very small bridging elements on substrates.

Yet another object of this invention is to provide apparatus for automating the bridging of conductive lands on substrates.

Still another object of this invention is to provide a new apparatus for automatically forming and positioning bridging elements that is simple and dependable in operation.

The apparatus of the invention for forming and positioning wire elements on a substrate has a substrate support, and a frame positionend adjacent the substrate support. A movable transfer element is mounted on the frame over the substrate support which has a vacuum bridging element retaining means on one end thereof. A means for ejecting the bridging element is also provided on the transfer element. A retractable mandrel is mounted on the frame, and a shearing and forming punch for cooperation with the mandrel. A wire supply means is also mounted on the frame having means for advancing wire over the mandrel and under the transfer element and forming punch. An actuation means is associated with the respective elements of the apparatus for sequentially positioning the mandrel, actuating the means for advancing wire, moving the transfer element into abutting and holding engagement with the wire, moving the shearing and forming punch to shear a length of wire and subsequently shaping same over the mandrel, retracting the mandrel and advancing the transfer element to position the resultant bridge on the substrate, and subsequently ejecting the bridging element.

The apparatus of our invention solves all of the prevailing problems associated with automating the forming and installation of bridging elements on electronic circuitry elements. The apparatus first forms the generally U-shaped bridge elements from a length of wire, and then, without releasing the resultant formed bridge, positions it on the substrate seating it with a uniform firm pressure. The transfer element is provided with a vacuum bridge retainer means to assure its retention during transfer and after forming. The air ejection means assures release of the element after it is in position on the substrate. The bridge is firmly seated on the conductors by application of sufficient pressure to cause deformation. This insures retention of the element during subsequent operations before it is permanently fixed by solder reflow. Further, the apparatus has the transfer element and associated elements mounted on the frame for rotation and setting to a number of predetermined angular positions. This enables the bridge element to be located on the substrate in any of a number of alternate angular relationships.

The foregoing and other objects, features and advantages of the invention will be apparent from the following more particular description of a preferred embodiment of the invention, as illustrated in the accompanying drawings.

FIGS. 8, 9, 10, and 11 are a series of views in broken section in greatly enlarged scale illustrating the sequential positions of the elements of the forming and positioning head during a cycle of operation.

Figures 8, 8A, 9, 10, 10A, 11:
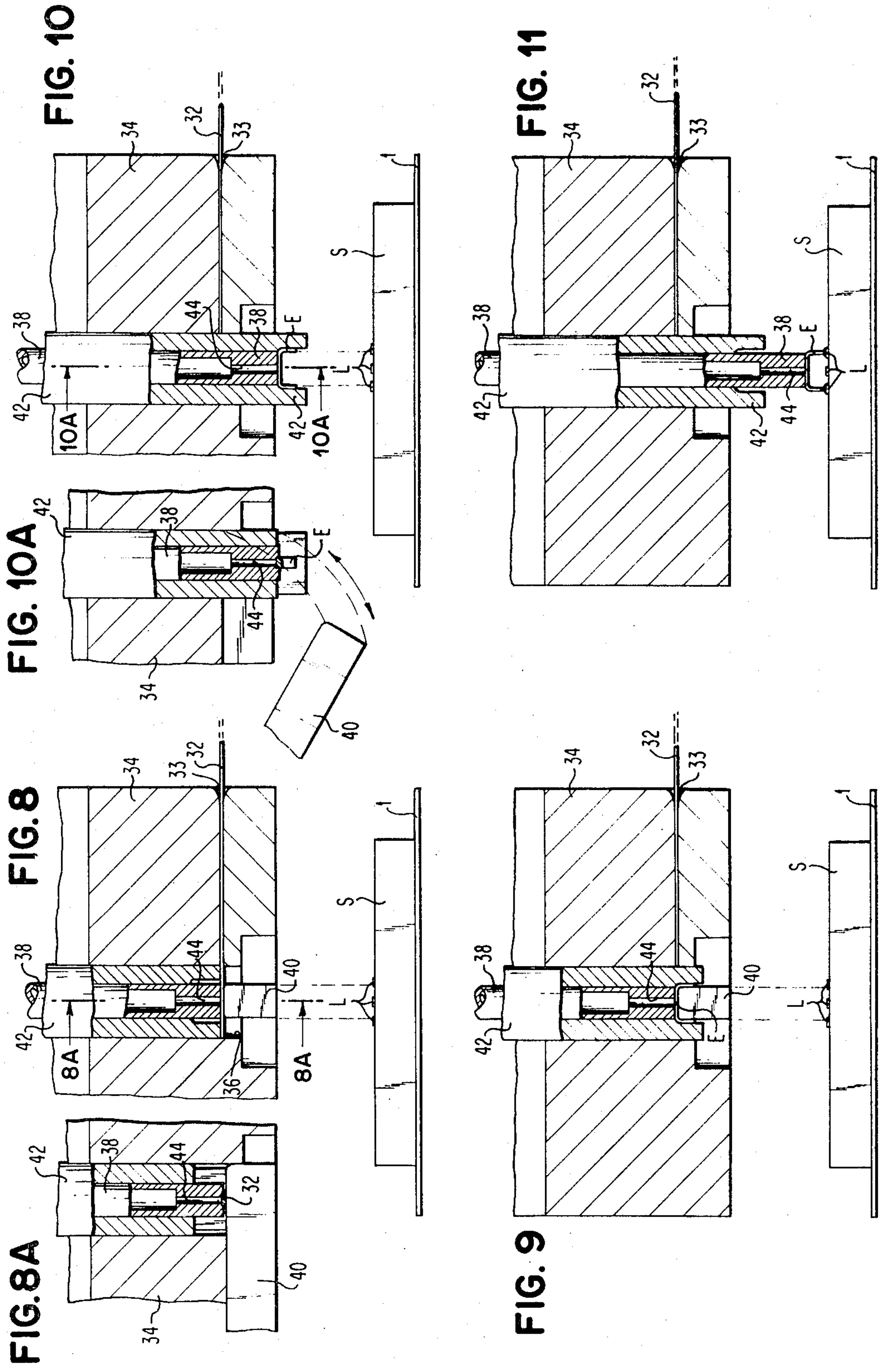

FIG. 8A is a view taken on line 8A—8A in FIG. 8.

FIG. 10A is a view taken on line 10A—10A in FIG. 10.

The figures of the drawing in the following discussion depict and describe a preferred specific embodiment of the forming and positioning apparatus of our invention, and it is to be understood that such is not to unduly limit the scope of the invention.

Figures 1, 2:
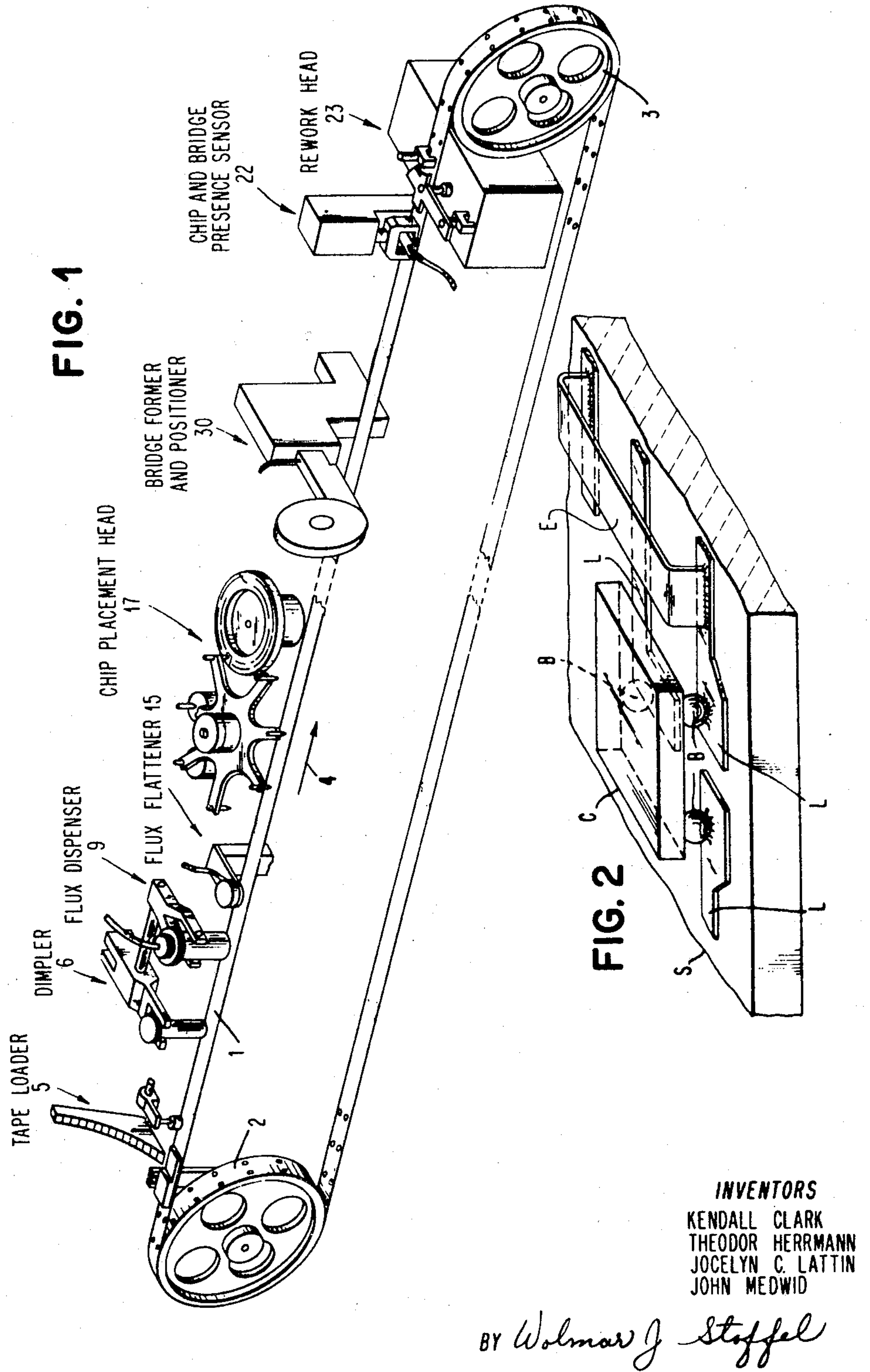
FIG. 1 is a diagrammatic view in perspective illustrating an overall automatic apparatus for positioning semiconductor chips and bridging elements on substrates incorporating the instant forming and positioning apparatus of the invention.
FIG. 2 is a fragmentary perspective view in broken section in greatly enlarged scale illustrating a typical arrangement of elements in a microminitaturized hybrid circuit module.

Referring now to the drawing there is illustrated in FIG. 1 an automatic assembly apparatus of the general type described and claimed in commonly assigned patent application, Ser. No. 459,179. The modified apparatus depicted in FIG. 1 differs from the apparatus described in the aforementioned patent application in that bridge element forming and positioning subcombination unit 30 is provided.

Referring to FIG. 1, the successive operating stations are shown schematically. A series of substrates are carried in sequence from one station to the next by a metal conveyor tape 1 entrained about a pair of pulleys 2 and 3 so that the upper run of tape 1 moves in the direction from left to right as viewed in the drawing. Tape loader 5 constitutes the first station and loads the substrates onto tape 1.

At the next station a dimpler 6 is provided having an array of coining punches to dimp a flat area on each of the pads of the substrate which will subsequently receive the terminals of chips or the ends of the U-shaped bridging elements produced and positioned by the apparatus 30 of the instant invention.

The next station is a flux dispenser 9 wherein droplets of flux are discharged onto the substrate area in the approximate locations preparatory to affixing the chips or bridge elements to the substrate.

To reduce the flux droplet height a flux flatener, generally indicated as 15, emits a jet of compressed air against each of the flux droplets to flatten and spread same on the substrate.

At the next station is a rotary semiconductor chip placement head indicated generally as 17. The number of chip placement heads provided will correspond to the number of chips to be positioned upon each of the substrates since each head 17 positions a chip at a particular location on a printed circuit pattern.

The substrates are then conveyed by the tape conveyor 1 to a bridging element forming and positioning apparatus 30 which will be described in detail. One or more bridge element forming and positioning apparatus can be provided depending on the number of bridges to be installed on the substrate.

After the substrates are carried by the tape conveyor 1 from the forming and positioning apparatus 30, the next operating station in sequence is a chip and bridge element presence sensor 22. This device tests each substrate to determine if the required number of chips and bridging elements have been positioned thereon. Each substrate is thereby characterized as an accept or reject and this characterization is retained in the memory circuitry of the electrical control system until the substrate is carried by conveyor 1 to a rework head 23. This final station may be selectively programmed to remove from the tape conveyor either all of the accepted substrates or all of the rejected substrates.

In FIG. 2 is illustrated in greatly enlarged scale a substrate S having mounted thereon lands L. A. chip C having ball terminals B is shown mounted on the ends of three lands. Adjacent the chip C is shown positioned a bridging element E which makes electrical contact with two spaced lands separated by a single land. The bridging elements E can be made of any suitable conductive material in any suitable form. The material can be a wire, or a ribbon as shown in FIG. 2.

The substrates S are preferably precisely positioned at each of the stations in the aforementioned apparatus with a clamp mechanism described and claimed in commonly assigned application Ser. No. 459,344.

The overall general mode of operation of the apparatus of the invention for forming and positioning bridging elements on substrates is illustrated in FIGS. 8–11 of the drawing. As indicated in FIG. 8 an elongated wire or ribbon 32 is advanced through an opening 33 in head 34 until it abuts the opposite side of bore 36. An elongated longitudinally movable transfer element 38 is moved downwardly into contact with the central portion of wire 32 which is also resting on a retractable mandrel 40. A vacuum is applied to passage 44 to retain the wire on the transfer element 38.

Shearing and forming punch 42 is thereafter moved downwardly, as indicated in FIG. 9, shearing off a length of wire and bending the ends thereof around mandrel 40. The resultant U-shaped bridging element E is retained on the end of transfer element 38 by a vacuum applied through aperture 44 to assure proper placement on lands. The mandrel 40 is thereafter moved out of the path of transfer element 38 as illustrated in FIGS. 10 and 10A. Both the transfer element 38 and shearing and forming punch 42 continue down a short distance.

Thereafter as indicated in FIG. 11 the shearing and forming punch 42 is halted and the transfer element 38 advanced moving the resultant bridging element E out of the punch 42 into position on substrate S. The element is prevented from turning or moving during transfer by the vacuum holding the element in a complementary shaped groove in the end of transfer element 38. After the bridging element E is firmly seated, preferably by the application of sufficient pressure to deform the lands and stabilize the element, it is ejected by transfer element 38 by a pulse of air transmitted through passage 44. The bridging element is held temporarily in place on the lands by a thin film of flux. The shearing and forming punch 42 and transfer element 38 are thereafter retracted back to the starting position and mandrel 40 moved back to its initial forming position. The substrate is then transferred into a heating chamber to fuse the ends of the bridging elements, and also the chip terminals, to the lands.

Figures 3, 4, 5:
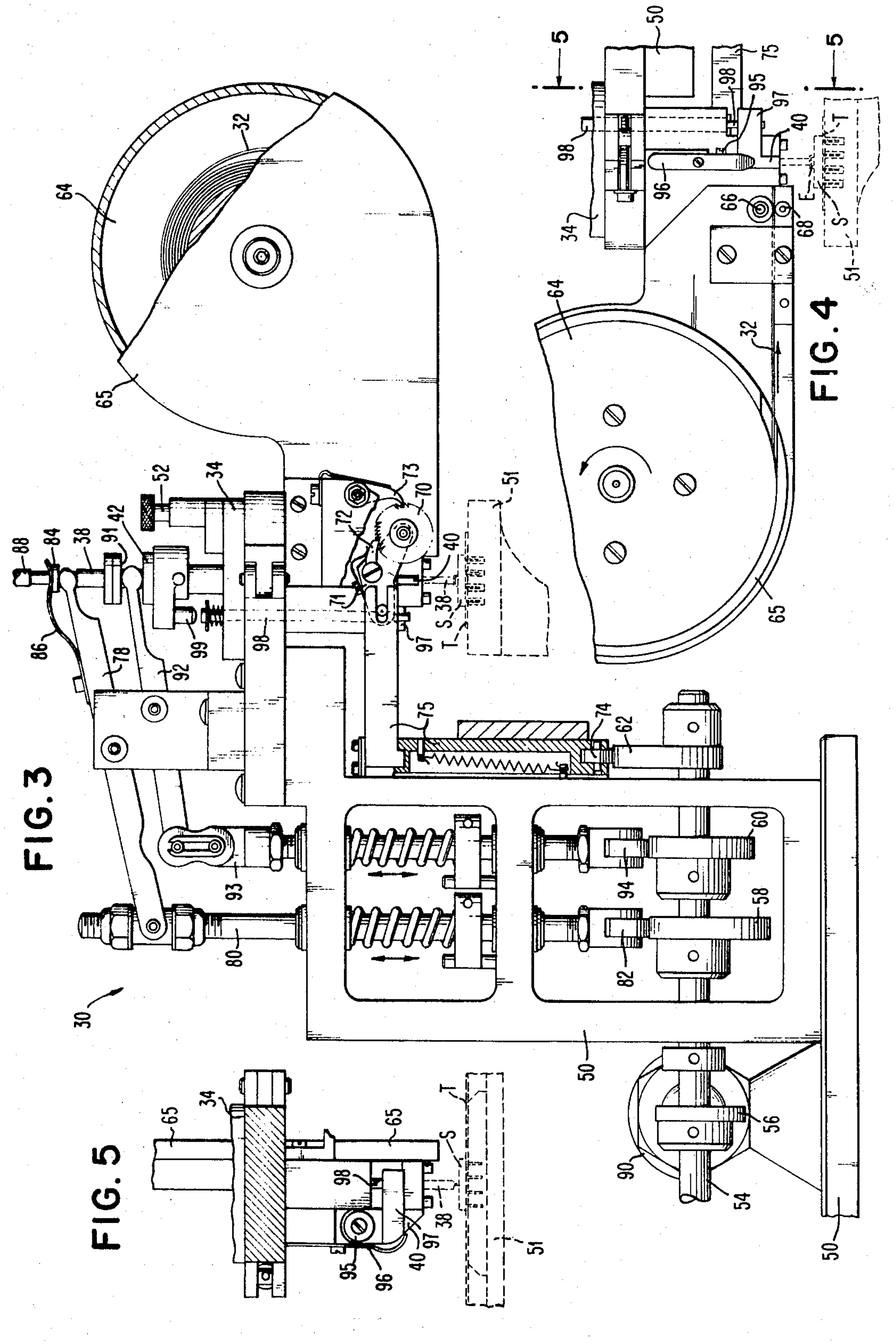
FIG. 3 is a side elevational view in partially broken section of a preferred specific embodiment of the bridge element forming and positioning apparatus of the invention.
FIG. 4 is a detail view in partially broken section of the bridge element forming and positioning mechanism taken on line 4—4 in FIG. 6.
FIG. 5 is a detail view in partially broken section taken on line 5—5 of FIG. 4.
Figures 6, 7:
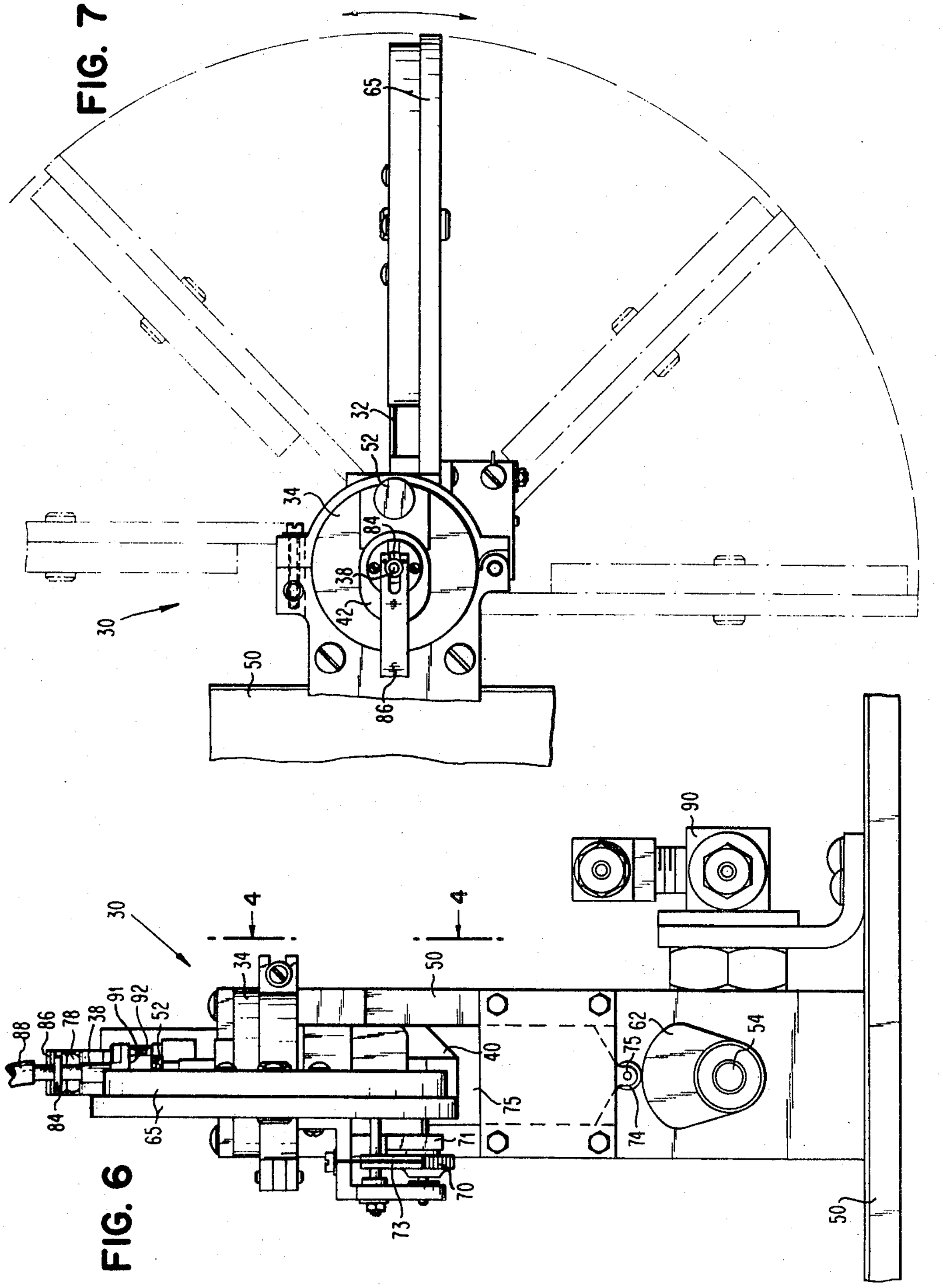
FIG. 6 is a front elevational view of the apparatus of the invention.
FIG. 7 is a top plan detail view of the forming and placement head illustrating alternate positions thereof in dotted lines.

As most clearly shown in FIG. 3 the apparatus 30 of the invention has a frame 50 mounted adjacent the substrate support, indicated in dotted lines as a tape 1 entrained over a platform 51. The base of frame 50 is mounted on an adjustable base (not shown) which has screw adjustments which enable it to be moved in the X and Y directions. This mounting enables the forming and positioning apparatus 30 to be mounted so that the bridge element E can be located at any desired location on the substrate held on the substrate support. The frame 50 includes a head 34 which is rotatable about a vertical axis above the substrate. The rotation of the head is most clearly shown in FIG. 7 by dotted lines indicating various angular positions. Rotation of head 34 enables placement of the bridging element E at different angular relations on the substrate. A lock consisting of a spring loaded bolt 52 secures the head in the desired relative angular position. Mounted in the lower part of frame 50 is a drive shaft 54 which is coupled to the driving mechanism of the overall apparatus. Cams 56, 58, 60, and 62 are mounted on shaft 54 whose respective functions will be discussed in detail.

The supply of wire or ribbon used to make the bridging elements is supported on a reel 64 enclosed in a cover 65 which is mounted on head 34. Wire or ribbon 32 is entrained around the reel and passes through rollers 66 and 68 shown most clearly in FIG. 4. Rollers 66 and 68 are used to advance the wire or ribbon 32 from the reel into position for the forming operation. The drive mechanism for roller 66 is most clearly shown in FIG. 3 and consists of a ratchet wheel 70 in driving relation to roller 66, a ratchet arm 71 with a pawl 72 in engagement with the teeth on ratchet wheel 70. Pawl 73 prevents the wheel 70 from reverse rotation. A cam follower 74 in engagement with cam 62 moves a slidable link 75 which actuates the ratchet arm 71 to thereby rotate roller 66. The wire advance mechanism is adjusted so that the wire is over driven to insure that the end abuts the wall opposite the entry aperture in the forming chamber. Transfer element 38 is actuated by a rocker arm 78, in turn actuated by push rod 80 and cam follower 82 in engagement with cam 58. Transfer element 38 has a radial flange 84 with the end of rocker arm 78 in abutment with the lower side and a leaf spring 86 in engagement on the upper side. Leaf spring 86 is a safety pressure release means which allows the transfer rod to yield under pressure, such as an improper seated substrate or the like. Further it makes possible the firm seating of the bridge element on the substrate even though there might possibly be a variation in thickness of the substrate S. The transfer element 38 is provided with a passage 44 terminating in the lower end thereof as most clearly indicated in FIGS. 8–11 of the drawings. The passage is connected with a flexible tube 88 in turn connected to a valve 90. Valve 90 is adapted to alternately apply either a vacuum or an air under pressure to the passage in the transfer element. Application of a vacuum to the transfer element results in retaining a bridge element on the end thereof, whereas application of air under pressure results in the ejection of an element. The valve 90, shown in FIG. 3, is actuated by cam 56.

The shearing and forming punch 42 is slidably mounted in rotatable head 34. Punch 42 has an annular groove 91 adjacent the top end thereof which is in engagement with the end of rocker arm 92.

Rocker arm 92 is actuated by rod 93 and cam follower 94 in engagement with cam 60. The various cams on shaft 54 are designed to produce the desired sequence of operations described previously and illustrated in FIGS. 8–11.

Retractable mandrel 40 is mounted on head 34 to rotate about pivot 95 as most clearly illustrated in FIG. 5 of the drawing. A leaf spring 96 is provided to bias the anvil 40 in forming position. Anvil 40 has an arm 97 adapted to be engaged by a push rod 98 slidably mounted in head 34. Abutment 99 on shearing and forming punch 42 is provided to actuate the push rod 98. A clearance between the abutment 99 and the upper end of push rod 98 is provided to delay moving the mandrel out of forming position until the push rod has moved downwardly forming the ends of the severed wire over the sides thereof. After the U-shaped bridging element is formed the abutment 99 strikes push rod 98 thus pivoting the mandrel out of position allowing the transfer arm 38 to deposit the resultant U-shaped bridging element on the substrate.

The apparatus and method of the invention can be modified to meet specific design problems of various operations. For example, the bridge element can be made to span a plurality of lands. Further, the apparatus can be used to form connections between lands and elements mounted on substrates, as for example a connection between a land and an inverted semiconductor chip with the terminals facing upwardly.

While the invention has been particularly shown and described with reference to the preferred embodiment thereof, it will be understood by those skilled in the art that various changes in form and details may be made therein without departing from the spirit and scope of the invention.

We claim:

1. Machine for forming and positioning a bridging element on a substrate comprising,
- a substrate support,
- a frame position adjacent said substrate support,
- a movable transfer element mounted on said frame over said substrate support,
- a vacuum means for retaining a bridging element on the end of said transfer element,
- an ejection means for removing the bridging element from said transfer element,
- a retractable mandrel mounted on said frame,
- a shearing and forming punch mounted on said frame for cooperation with said mandrel,
- a wire supply means mounted on said frame having means for advancing wire over said mandrel and under said transfer element and forming punch,
- actuation means for sequentially positioning said mandrel, actuating said means for advancing wire, moving said transfer element into abutting and holding engagement with the wire, moving said shearing and forming punch for shearing a length of wire and subsequently shaping same over said mandrel, retracting said mandrel, advancing said transfer element and positioning the resultant bridging element on the substrate, and subsequently ejecting the bridging element.

2. The apparatus of claim 1 wherein,
- said transfer element includes a passage terminating in an aperture on the end thereof adapted to underlie a bridging element held on said transfer element,
- a source of vacuum,
- a source of air under pressure,
- a valve in communication with said passage and adapted to alternately connect the passage with said source of vacuum and source of air under pressure,
- means operatively associating said valve with said actuation means for alternately retaining and ejecting the bridging element from the transfer element.

3. The apparatus of claim 1 wherein said frame includes,
- a rotatable head having mounted thereon said transfer element, said mandrel, said shearing and forming punch, and said wire supply means,
- and a lock means for securing said rotatable head in a fixed relationship relative said frame and substrate support,
- the head assembly facilitating the positioning of bridging elements by said transfer element at different angular positions on the substrate.

4. The apparatus of claim 1 wherein said actuation means includes, a drive shaft,
a first, second and third cams on said shaft,
a first cam follower associated with said first cam,
a first rocker arm actuated by said first cam follower connected to said transfer element,
a second cam follower associated with said second cam,
a second rocker arm actuated by said second cam follower connected to said shearing and forming punch,
a third cam follower associated with said third cam,
linkage means actuated by said third cam follower for operatively actuating said means for advancing wire.

5. The apparatus of claim 4 wherein,
said retractable mandrel is pivotally supported for movement into and out of forming position,
an abutment means is provided on said shearing and forming punch,
a longitudinally slidable link means is associated with said abutment means and said mandrel to move same into and out of forming position.

6. The apparatus of claim 4 wherein a safety pressure release means is provided for said transfer element comprised of,
an abutment on said transfer element having a first surface and a second surface,
and end of said first rocker arm in operative driving contact with said first surface, and
a spring biased element mounted on said rocker arm in operative biasing contact with said second surface of said abutment.

7. The apparatus of claim 1 wherein means for advancing wire is comprised of,
a pair of rollers adapted to frictionally engage wire therebetween,
a ratchet which associated in driving relationship to one of said rollers,
a pawl in driving relation to said ratchet wheel, an abutment opposite said pair of rollers for positively gauging the length of wire,
said pawl associated with said actuation means such that the wire is moved into abutment with said abutment and subsequently overdriven to assure engagement.

8. A machine for fabricating an element from continuous stock and positioning the resultant element on a substrate comprising,
a work station,
a substrate support means at said work station,
means for feeding stock to said work station,
fabrication means at said work station including a means for severing said stock into increments and a means for shaping said severed increments into elements to be positioned,
movable element transfer means at said work station for moving the resultant fabricated element from said fabricating means and precisely positioning on a substrate supported by said substrate support,
vacuum means associated with said element transfer means to selectively retain the element thereon.

References Cited

UNITED STATES PATENTS

| | | | |
|---|---|---|---|
| 2,893,010 | 7/1959 | Stuhre | 29—34 |
| 2,958,869 | 11/1960 | Drukker et al. | |
| 3,194,098 | 7/1965 | Kimball et al. | 83—152 X |
| 3,200,481 | 8/1965 | Lenders | 29—203 |
| 3,314,296 | 4/1967 | Clark et al. | 74—24 |
| 3,337,941 | 8/1967 | Drop | 228—6 X |
| 3,344,900 | 10/1967 | Drop. | |

THOMAS H. EAGER, Primary Examiner

U.S. Cl. X. R.

83—152; 228—5, 6